(12) United States Patent
Chaudhry et al.

(10) Patent No.: US 7,503,025 B2
(45) Date of Patent: Mar. 10, 2009

(54) METHOD TO GENERATE CIRCUIT ENERGY MODELS FOR MACROS CONTAINING INTERNAL CLOCK GATING

(75) Inventors: Rajat Chaudhry, Austin, TX (US); James Scott Neely, Wappingers Falls, NY (US); Daniel Lawrence Stasiak, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 224 days.

(21) Appl. No.: 11/044,599

(22) Filed: Jan. 27, 2005

(65) Prior Publication Data

US 2006/0167673 A1     Jul. 27, 2006

(51) Int. Cl.
*G06F 17/50* (2006.01)
*G06F 9/45* (2006.01)

(52) U.S. Cl. .................................... 716/6; 716/4; 716/5
(58) Field of Classification Search ..................... 716/2, 716/4–6
See application file for complete search history.

(56) References Cited

U.S. PATENT DOCUMENTS

| | | | |
|---|---|---|---|
| 5,227,672 A * | 7/1993 | Sawtell | 327/141 |
| 5,668,732 A * | 9/1997 | Khouja et al. | 702/60 |
| 6,212,665 B1 | 4/2001 | Zarkesh et al. | |
| 6,345,379 B1 | 2/2002 | Khouja et al. | |
| 6,397,170 B1 | 5/2002 | Dean et al. | |
| 6,810,482 B1 | 10/2004 | Saxena et al. | |
| 7,051,300 B1 | 5/2006 | Shen et al. | |
| 2002/0171483 A1 * | 11/2002 | Shinjo et al. | 330/136 |
| 2003/0085732 A1 * | 5/2003 | Hernandez-Marti | 326/30 |
| 2004/0019859 A1 | 1/2004 | Ravi et al. | |
| 2004/0239189 A1 * | 12/2004 | Sundstrom | 307/32 |
| 2005/0030268 A1 * | 2/2005 | Zhang et al. | 345/83 |
| 2005/0050481 A1 | 3/2005 | Keller et al. | |
| 2005/0050495 A1 | 3/2005 | McGuffin et al. | |
| 2005/0091427 A1 * | 4/2005 | Yoshida et al. | 710/48 |
| 2005/0102643 A1 * | 5/2005 | Hou et al. | 716/6 |
| 2005/0159907 A1 * | 7/2005 | Chaudhry et al. | 702/60 |
| 2006/0031795 A1 | 2/2006 | Rahmat et al. | |
| 2006/0080076 A1 | 4/2006 | Lahiri et al. | |
| 2006/0168490 A1 * | 7/2006 | McCormack et al. | 714/726 |

* cited by examiner

*Primary Examiner*—Jack Chiang
*Assistant Examiner*—Suresh Memula
(74) *Attorney, Agent, or Firm*—Carr LLP; Matt Talpis

(57) ABSTRACT

A method, a computer program, and an apparatus are provided for generating circuit energy models for a macro containing internal clock gating. Circuit energy models are used to estimate system power consumption. The present invention enables circuit energy models to be created for macros that contain internal clock gating and multiple clock gating inputs. To achieve accurate power estimates a voltage supply is connected to each clock activate signal. Energy tables are then created based upon the macro's input switching factor percentage and clock activation percentage. These power tables are generated from a minimum number of power simulations. By incorporating internally generated clock activate signals into the power estimations the macro energy tables are much more accurate.

9 Claims, 11 Drawing Sheets

*FIG. 2*

| | SWITCHING FACTOR % | | | | | |
|---|---|---|---|---|---|---|
| | 0 | 10 | 20 | 30 | 40 | 50 |
| POWER | <u>0</u> | .1 | .2 | .3 | .4 | <u>.5</u> |

UNDERLINED VALUES FROM SIMULATION
BLACK VALUES LINEAR ESTIMATES

*FIG. 6*

| | 0 | 10 | 20 | 30 | 40 | 50 |
|---|---|---|---|---|---|---|
| 0 | <u>0</u> | | | | | <u>.5</u> |
| 20 | .1 | .1 | .2 | .3 | .4 | .6 |
| 40 | .2 | .2 | .3 | .4 | .5 | .7 |
| 60 | .3 | .3 | .4 | .5 | .6 | .8 |
| 80 | .4 | .4 | .5 | .6 | .7 | .9 |
| 100 | <u>.5</u> | .6 | .7 | .8 | .9 | <u>1.0</u> |

SWITCHING FACTOR %

CLOCK ACTIVE %

UNDERLINED VALUES FROM SIMULATION
BLACK VALUES LINEAR ESTIMATES

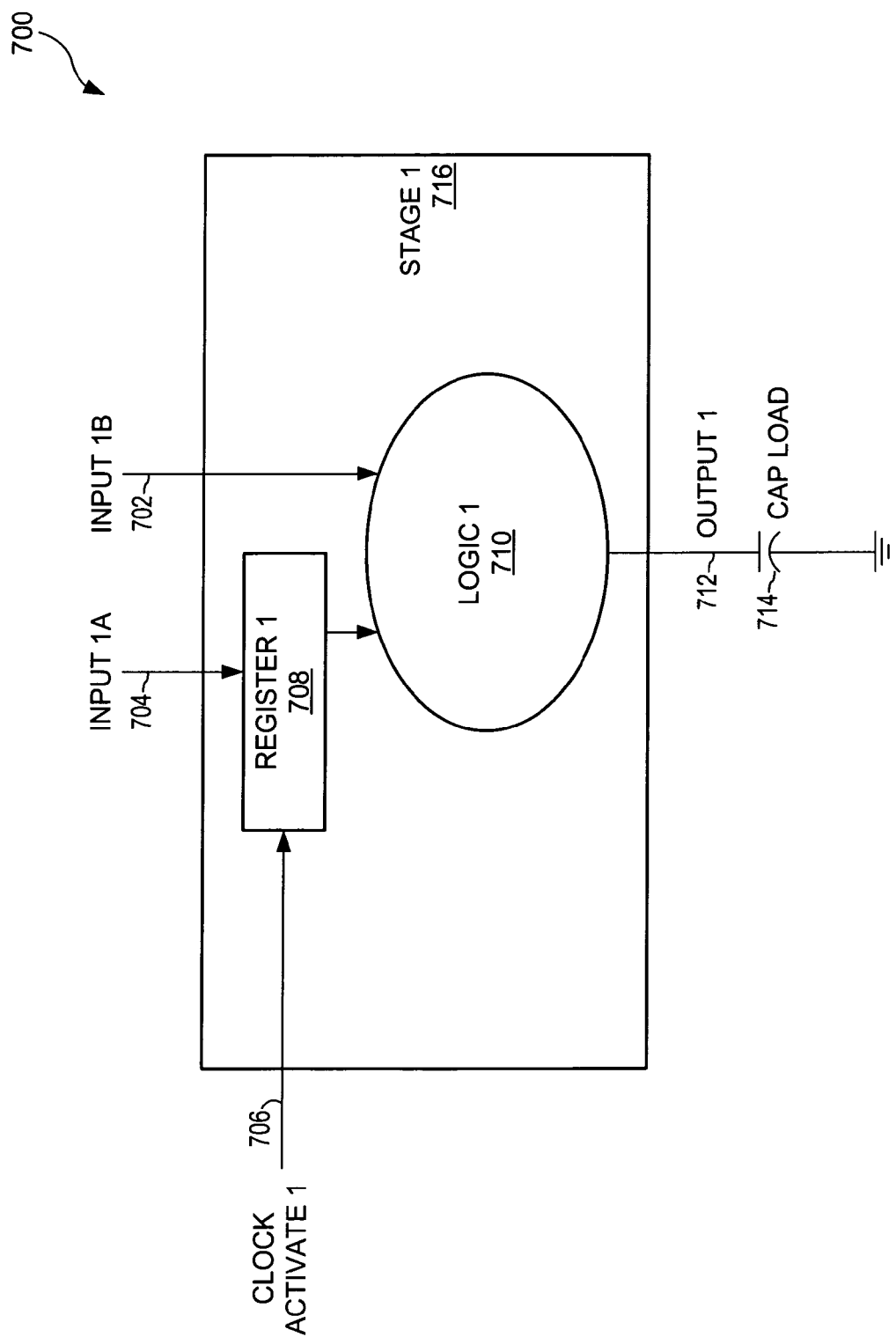

METHOD TO GENERATE CIRCUIT ENERGY MODELS FOR MACROS CONTAINING INTERNAL CLOCK GATING

FIELD OF THE INVENTION

The present invention relates generally to power estimation in chip design, and more particularly, to generating energy tables for macros containing internal clock gating.

DESCRIPTION OF THE RELATED ART

System power is an important issue in Very Large-Scale Integration (VLSI) chip design. Battery life, packaging cost, and power delivery cost are factors that are affected by chip power consumption. Power estimates are used in place of methodical testing or methodical simulation to save time and resources. These estimates can be produced from a minimal number of simulations or tests. To lower the power consumption of a particular chip design it is important that the power estimates are accurate.

Chip power estimation starts at the macro level. A chip is made up of many macros, which are small circuits within the chip. Each macro within a chip generates an energy model or rule. Referring to FIG. 1 of the drawings, reference numeral 100 is a block diagram depicting a macro that receives inputs and generates signal outputs. The latch macro 108 receives data inputs 102 and control inputs 104. The data inputs 102 are random and depend upon other circuits and signals within the system. The control inputs 104 are random or specified, which means that they can depend upon other circuits and signals within the system or they can be controlled to produce desired outputs. The latch macro 108 produces the signal outputs 106 in response to the data inputs 102 and the control inputs 104.

Referring to FIG. 2 of the drawings, reference numeral 200 is a hypothetical energy table that estimates the power consumption of a macro based upon the input switching factor percentage. The input switching factor refers to the data inputs 102 and how often they change state. Therefore, a 50% switching factor would indicate that the data inputs 102 change states every other cycle. The switching factor percentages in this table run from 0% to 50%. Simulations were done to accurately estimate the power consumption at a 0% switching factor and at a 50% switching factor. The rest of the values in the table are linear estimates based upon the simulation results. Based upon these values, the power consumption of this specific macro at any switching factor between 0% and 50% can be accurately estimated. Furthermore, if the power consumption of the macros within a chip can be estimated, then the power consumption of the whole chip can be estimated.

SUMMARY OF THE INVENTION

The present invention provides a method, a computer program, and an apparatus for generating circuit energy models for a macro containing internal clock gating. Accurate circuit energy models are important for estimating the power consumption of a specific chip. The estimation process begins by estimating the power consumption of macros within the chip, which ultimately leads to a power estimation of the whole chip. This invention provides a means to produce energy models based upon two parameters: input switching factor percentage and clock activation percentage.

To produce these energy tables the specific macro must be represented in a computer program. From this model circuit power simulations can be generated for any combination of input switching factor percentages and clock activation percentages. Accurate power simulations are difficult when a macro contains internally generated clock activate signals. With multiple clock gating inputs and internal clock activate signals the clock activation percentage can be estimated by connecting voltage supplies to all of the clock activate signals. The voltage supplies are used to run accurate power simulations. After a group of power simulations are generated the rest of the values in the energy table are filled in a linear fashion. The resulting energy table contains accurate power estimations of a macro containing multiple gating inputs and internally generated clock activate signals for a wide variety of input switching factor percentages and clock activation percentages.

BRIEF DESCRIPTION OF THE DRAWINGS

For a more complete understanding of the present invention and the advantages thereof, reference is now made to the following descriptions taken in conjunction with the accompanying drawings, in which:

FIG. 2 is a hypothetical energy table that estimates the power consumption of a macro based upon the input switching factor percentage;

FIG. 5 is a block diagram illustrating a macro with clock gating on;

FIG. 6 is a hypothetical energy table that estimates the power consumption of a macro based upon the input switching factor percentage and the clock activation percentage;

FIG. 7 is a block diagram depicting a macro that receives one clock activate signal;

DETAILED DESCRIPTION

In the following discussion, numerous specific details are set forth to provide a thorough understanding of the present invention. However, those skilled in the art will appreciate that the present invention may be practiced without such specific details. In other instances, well-known elements have been illustrated in schematic or block diagram form in order not to obscure the present invention in unnecessary detail. Additionally, for the most part, details concerning network communications, electromagnetic signaling techniques, and the like, have been omitted inasmuch as such details are not considered necessary to obtain a complete understanding of the present invention, and are considered to be within the understanding of persons of ordinary skill in the relevant art.

The power simulations of these macros are accomplished by computer software programs. Typically, one computer program sets up the circuits and the inputs into the circuits and another computer program carries out the simulation. The former computer program can be described as a design methodology and tool set for detailed analysis of power, as well as on-chip noise and reliability of the network. For one example, a Common Power Analysis Methodology for microprocessors (CPAM) program allows a user to set up a specific macro, including accurate input states that can be utilized for macro power simulations. The other computer program is used to provide quick, accurate power simulations. For one example, ACES is a fast circuit simulator program that allows a user to accomplish timing simulations, static timing analysis, noise analysis, and power analysis. In combination these computer programs provide accurate power simulations.

Referring to FIG. 2, programs such as CPAM and ACES provide the simulated power estimates that are required to make the energy table. These power estimates are created by setting up the circuit and the correct input states through CPAM. Then an ACES simulation is used to produce the power estimates. Signals are held high, low or switched high and low in a particular sequence or randomly. Based upon the input pins switching factor CPAM generates a table of the power estimates for the circuit. As shown in FIG. 2, CPAM generates an estimate at 0% switching factor and an estimate at 50% switching factor and then fills in the rest of the table values in a linear fashion.

Figure 1:
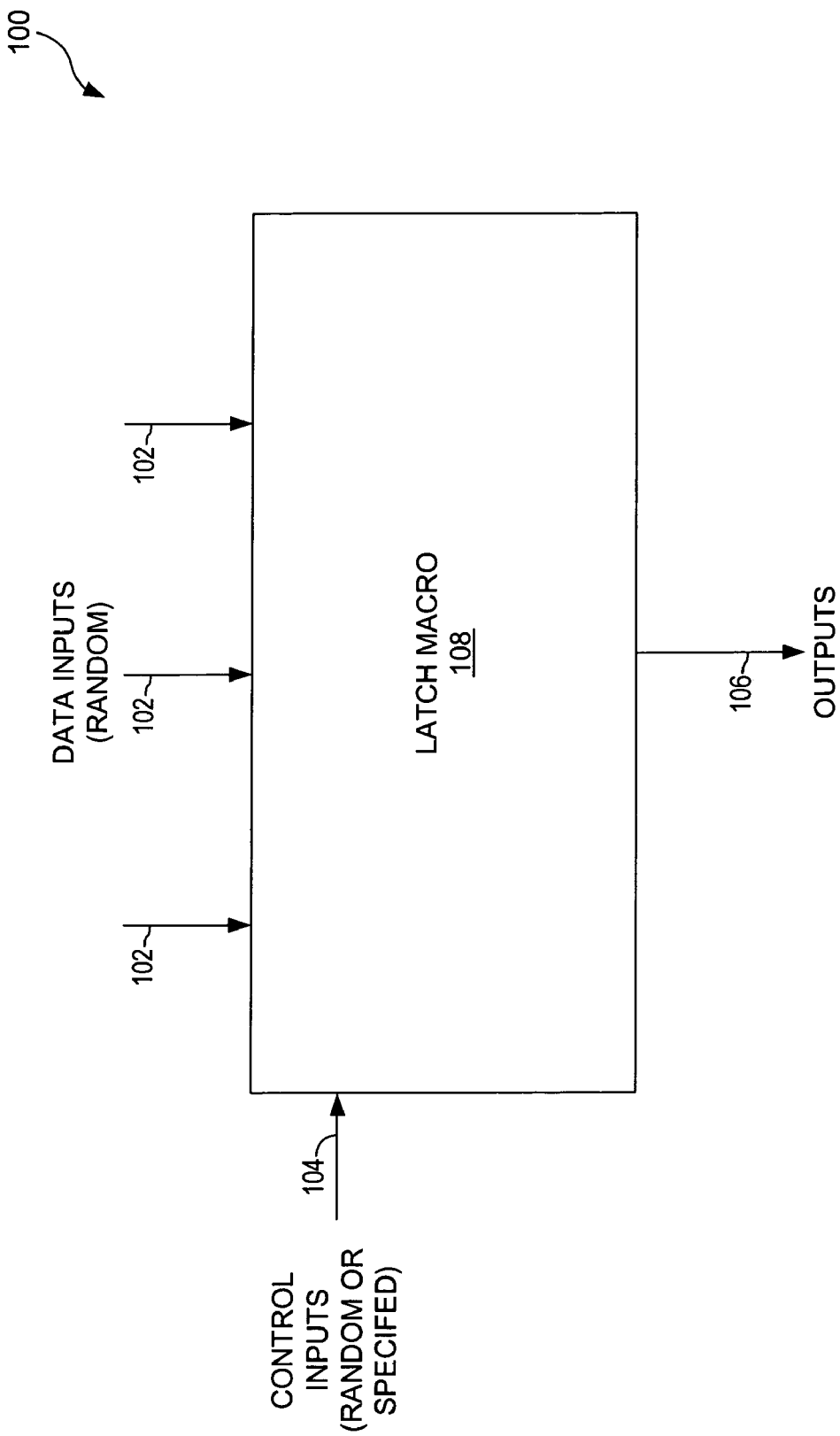
FIG. 1 is a block diagram depicting a macro that receives inputs and generates signal outputs.
Figure 3:
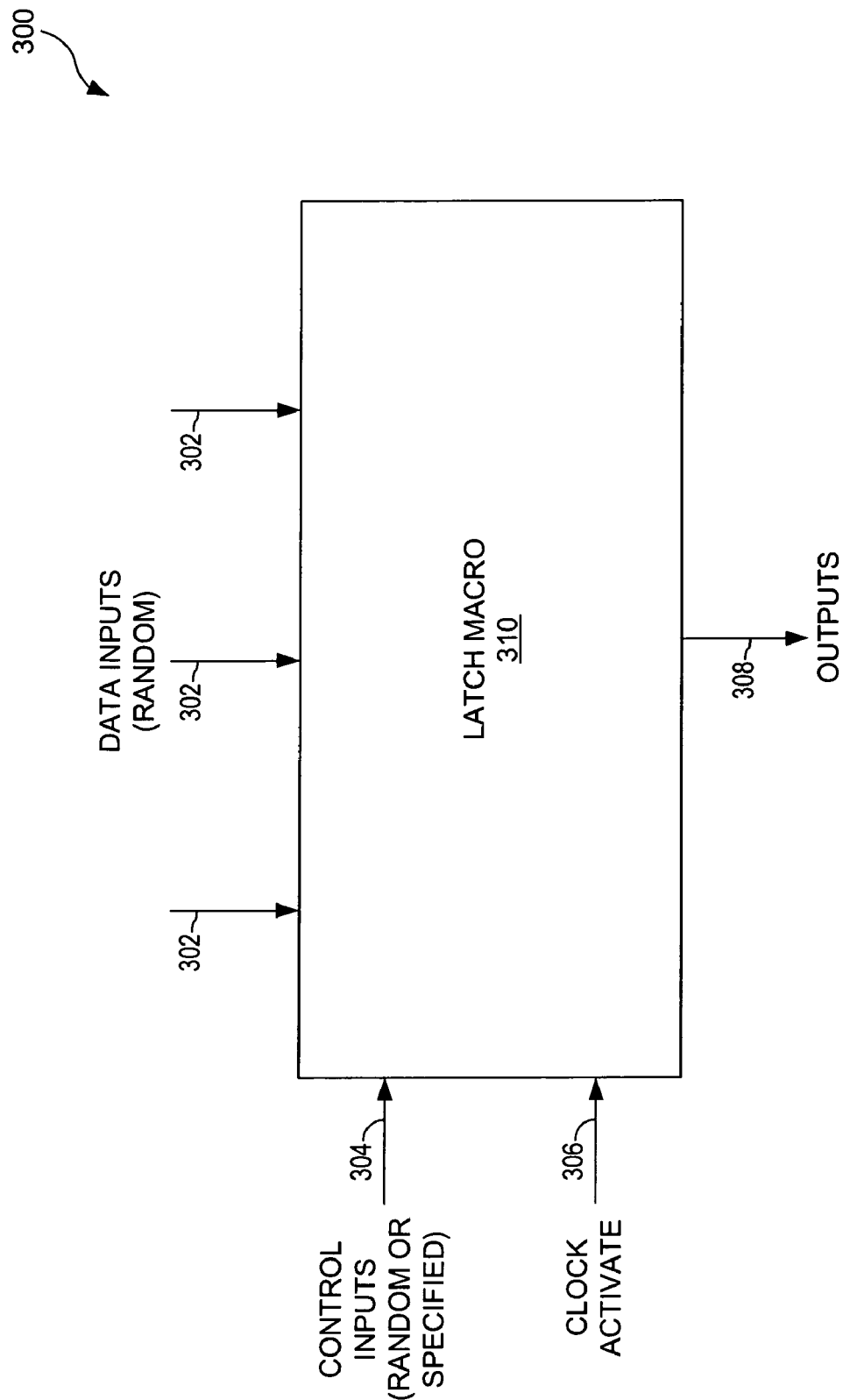
FIG. 3 is a block diagram depicting a macro that receives signal inputs, a clock signal, and a clock activate signal, and generates signal outputs.

Referring to FIG. 3 of the drawings, reference numeral 300 is a block diagram depicting a macro that receives signal inputs, a clock signal, and a clock activate signal, and generates signal outputs. The conventional methods for producing an energy table were unable to estimate the power consumption of a macro that received a clock activate signal along with the control inputs. The latch macro 310 receives data inputs 302, control inputs 304, and a clock activate signal 306. The data inputs 302 are random and depend upon other circuits and signals within the system. The control inputs 304 are random or specified, which means that they can depend upon other circuits and signals within the system, or they can be controlled to produce desired output signals. The clock activate signal 306 is used to enable or disable a clock signal. This clock signal would be a control input 304 of the latch macro 310. The latch macro 310 produces signal outputs 308 in response to the data inputs 302, the control inputs 304, and the clock activate signal 306.

Figure 4:
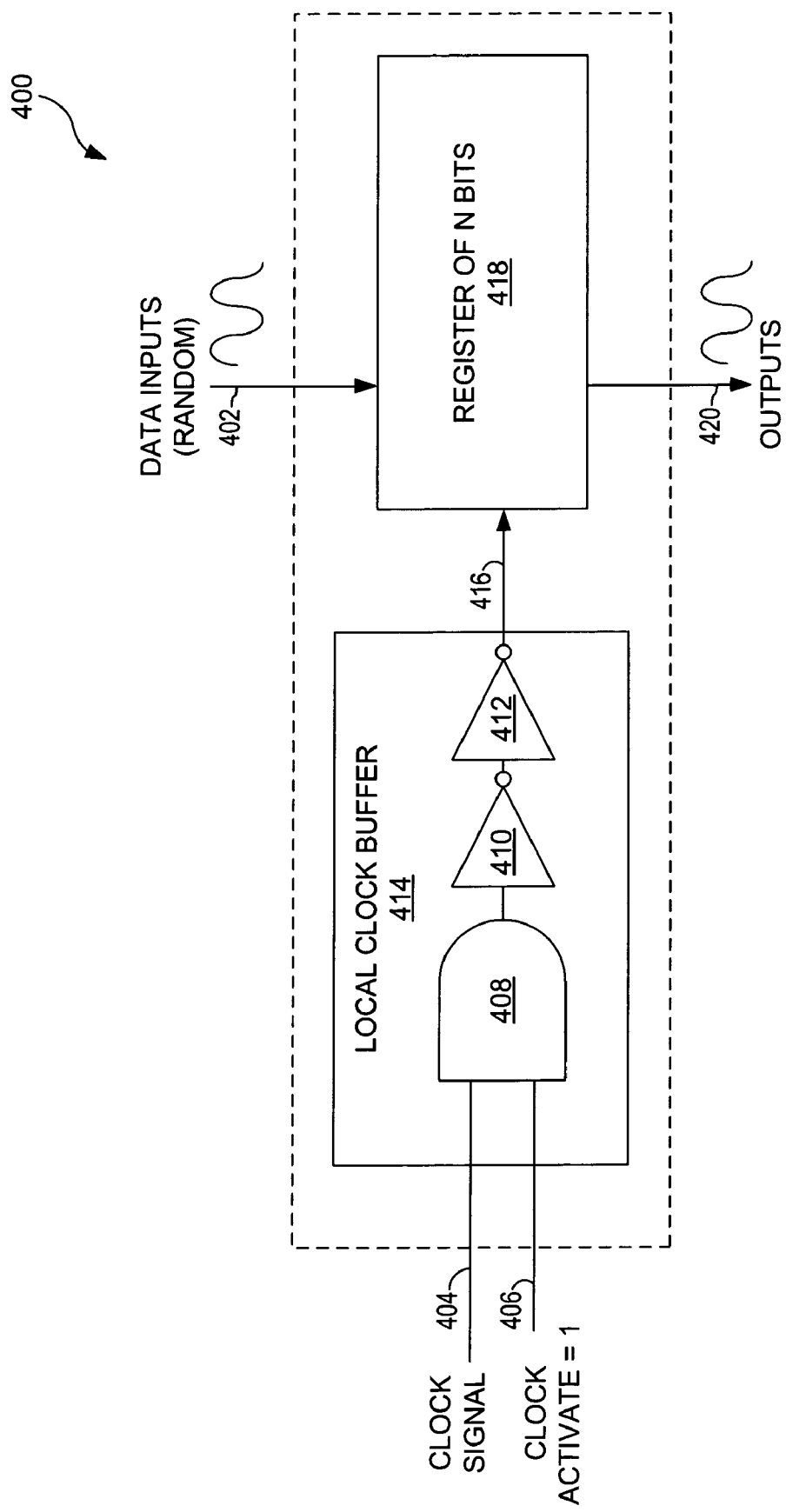
FIG. 4 is a block diagram illustrating a macro with clock gating off.

Referring to FIG. 4 of the drawings, reference numeral 400 is a block diagram illustrating a macro with clock gating off. FIG. 4 is a more detailed illustration of FIG. 3 with the clock activate signal 406 being implemented to turn the clock gating off. The clock signal 404 and the clock activate signal 406 are inputs into the local clock buffer 414. The local clock buffer is made up of an AND gate 408 connected to two inverters 410 and 412. The output 416 of the local clock buffer 414 is an input to a register 418. The data inputs 402 are also received by the register 418. The register produces signal outputs 420 in response to the local clock buffer 414 and the data inputs 402. By setting the clock activate signal 406 to "1," the AND gate 408 is enabled and the output 416 is a time delayed version of the clock signal 404. Therefore, the signal outputs 420 are a wave-like transformation of the data inputs 402. When the clock activate signal 406 is set to "1" the clock gating is off.

Figure 5:
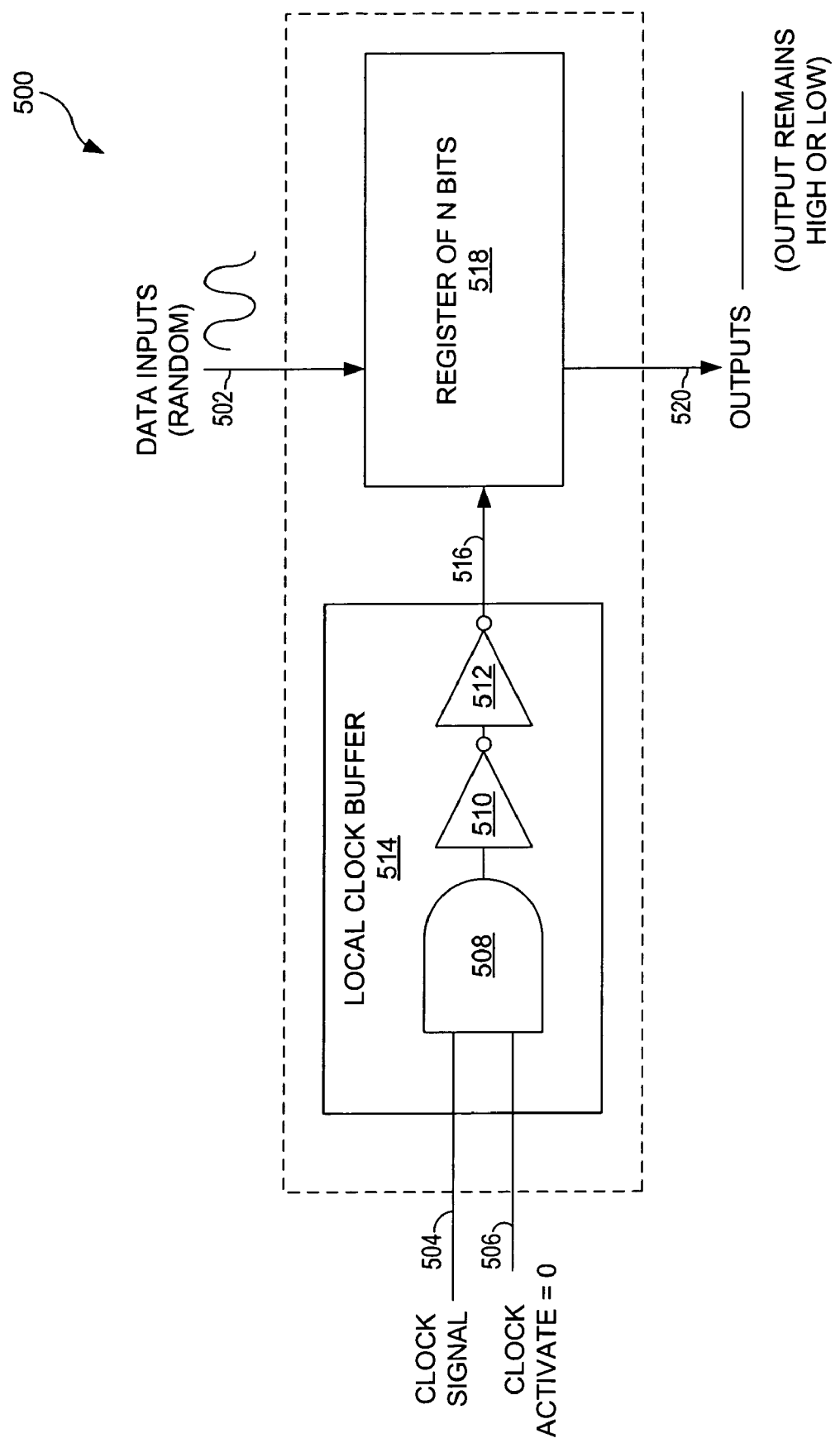

Referring to FIG. 5 of the drawings, reference numeral 500 is a block diagram illustrating a macro with clock gating on. FIG. 5 is a more detailed illustration of FIG. 3 with the clock activate signal 506 being implemented to turn the clock gating on. The clock signal 504 and the clock activate signal 506 are inputs into the local clock buffer 514. The local clock buffer is made up of an AND gate 508 connected to two inverters 510 and 512. The output 516 of the local clock buffer 514 is an input to a register 518. The data inputs 502 are also received by the register 518. The register produces signal outputs 520 in response to the local clock buffer 514 and the data inputs 502. By setting the clock activate signal 506 to "0," the AND gate 508 is shut off and the output 516 remains high or low based upon the number of inverters in the local clock buffer 514. Therefore, the signal outputs 520 remain high or low due to the local clock buffer output 516. When the clock activate signal 506 is set to "0" the clock gating is on.

Referring to FIG. 6 of the drawings, reference numeral 600 is a hypothetical power table that estimates the power consumption of a macro based upon the input switching factor percentage and the clock activation percentage. Computer programs, such as CPAM and ACES, are used to generate these power tables. Once again, only a few values are estimated through simulation and the rest of the table is generated in a linear fashion. In this table the two parameters that affect power consumption are input switching factor percentage and clock activation percentage. Clock activation percentage can be described as the percentage of time that clock gating is off in the macro. FIG. 4 provides an illustration of a macro with clock gating off. Accordingly, if clock gating is always off then the clock activation percentage would be 100%. If clock gating is always on then the clock activation percentage would be 0%. The clock activation percentage can also be used if there are two local clock buffers. For example, if one local clock buffer always has clock gating off and another local clock buffer always has clock gating on, then the clock activation percentage would be 50%. Furthermore, if both local clock buffers have clock gating off half of the time then the clock activation percentage is also 50%. This table provides accurate power estimates for a macro with an input switching factor between 0% and 50% and a clock activation between 0% and 100%.

This table is created by simulating the power estimates for the macro in four separate scenarios. For one embodiment, first the computer programs simulate the macro with a 0% switching factor and a 0% clock activation and load the power estimate into the table. Then, a simulation for a 50% switching factor and a 0% clock activation is accomplished and the power estimate is loaded into the table. Next, a simulation for a 0% switching factor and a 100% clock activation is carried out and the power estimate is loaded into the table. Lastly, the computer programs simulate the macro with a 50% switching factor and a 100% clock activation and load the power estimate into the table. After these four simulations are finished, the computer programs fill in the rest of the table in linear fashion.

Referring to FIG. 7 of the drawings, reference numeral 700 is a block diagram depicting a macro that receives one clock activate signal. Register 1 708 receives input 1A 704 and a clock activate 1 signal 706 as inputs. The output of register 1 708 is transmitted to Logic 1 710. Input 1B 702 is also an input of Logic 1 710. In response to input 1B 702 and the output of register 1 708, Logic 1 710 produces an output 1 signal 712. A capacitor 714 is used to provide the wire load on the output 1 signal 712. This capacitor is connected to ground. Register 1 708 and logic 1 710 make up stage 1 716 of the macro. Reference numeral 700 illustrates a simple one stage macro.

Figure 8A:
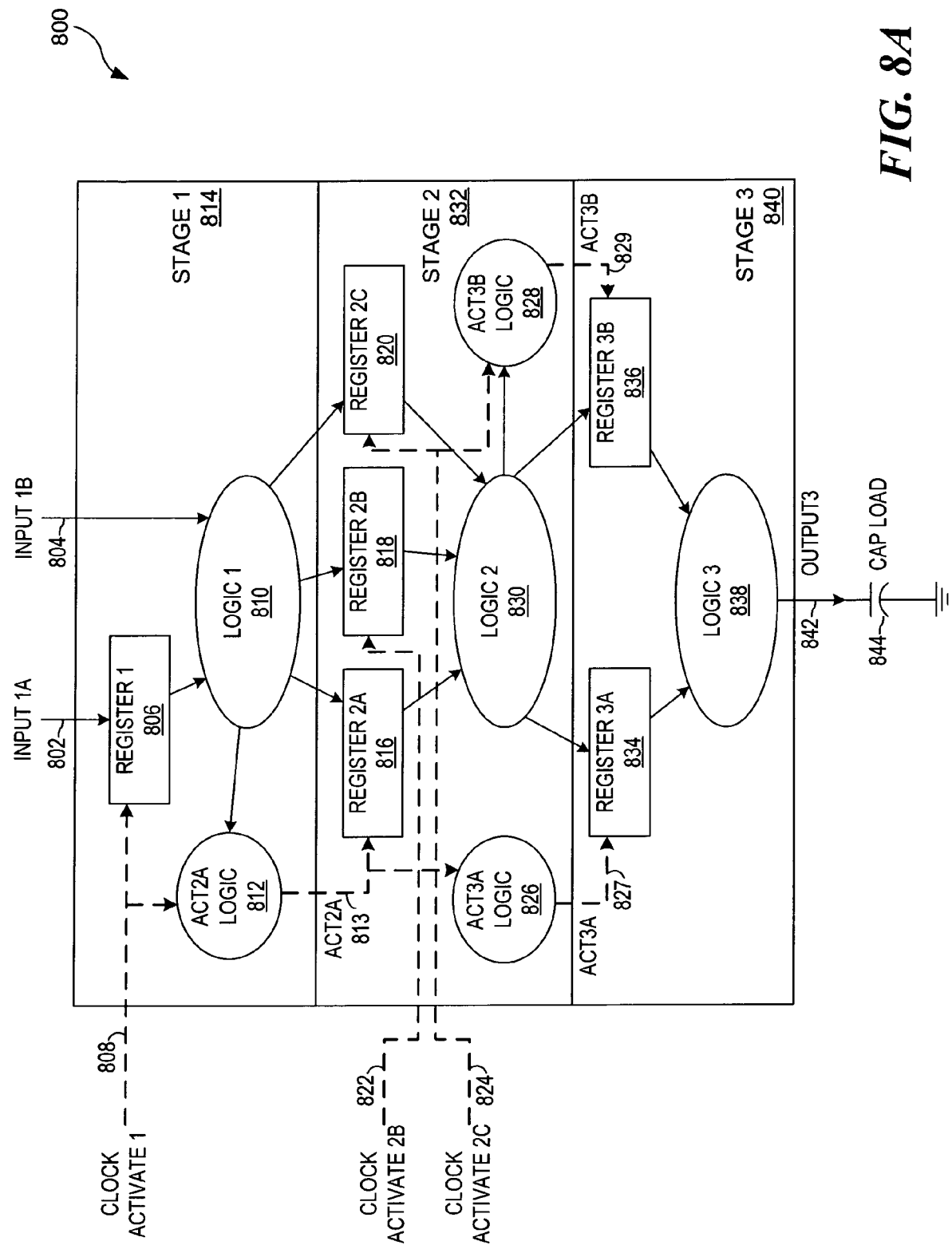
FIG. 8A is a block diagram depicting a macro that receives three clock activate signals and contains three internally generated clock activate signals.

Referring to FIG. 8A of the drawings, reference numeral 800 is a block diagram depicting a macro that receives three clock activate signals and contains three internally generated clock activate signals. In larger macros, internal clock signals are generated due to internal logic. The internal clock signals cannot be controlled from outside of the macro, and therefore they make it difficult to estimate the power consumption of the macro. The dotted lines in FIG. 8A indicate the internal and external clock activate signals. FIG. 8A illustrates a three stage macro that receives three clock activation signals, clock activate 1 808, clock activate 2B 822, and clock activate 2C 824, and contains three internally generated clock activation signals, ACT2A 813, ACT3A 827, and ACT3B 829. Register 1 806 receives inputs of the clock activate 1 signal 808 and input 1A 802. The output of register 1 806 is transmitted to Logic 1 810. Logic 1 also receives input 1B 804. ACT 2A Logic 812 receives the clock activate 1 signal 808 and the output of Logic 1 810 as inputs. ACT 2A Logic 812 produces an internal clock activate signal, ACT 2A 813. Register 1 806, Logic 1 810, and ACT 2A Logic 812 make up the first stage 814 of this macro.

The output of Logic 1 810 is transmitted to register 2A 816, register 2B 818 and register 2C 820. Clock activate signal ACT 2A 813 is transmitted to register 2A 816 and ACT 3A Logic 826. Clock activate 2B signal 822 is transmitted to register 2B 818. Clock activate 2C signal 824 is transmitted to register 2C 820, and ACT 3B Logic 828. The outputs of register 2A 816, register 2B 818, and register 2C 820 are transmitted to Logic 2 830. ACT 3A Logic 826 produces an internal clock activate signal, ACT 3A 827. The output of Logic 2 830 is transmitted to ACT 3B Logic 828. ACT 3B Logic 828 produces an internal clock activate signal, ACT 3B 829. Register 2A 816, register 2B 818, register 2C 820, Logic 2 830, ACT 3A Logic 826, and ACT 3B Logic 828 make up the second stage 832 of this macro.

The output of Logic 2 830 is transmitted to register 3A 834 and register 3B 836. Register 3A 834 also receives the internal clock activate signal, ACT 3A 827 as an input. In addition, register 3B 836 receives the internal clock activate signal, ACT 3B 829 as an input. The outputs of register 3A 834 and register 3B 836 are transmitted to Logic 3 838. Register 3A 834, register 3B 836, and Logic 3 838 make up the third stage 840 of this macro. The output 3 signal 842 of Logic 3 838 is the output of the macro. A capacitor 844 is used to provide the wire load on the output 3 signal 842. This capacitor 844 is connected to ground. Overall, FIG. 8A is an illustration of a three stage macro with three clock activate signals and three internally generated clock activate signals.

Figure 8B:
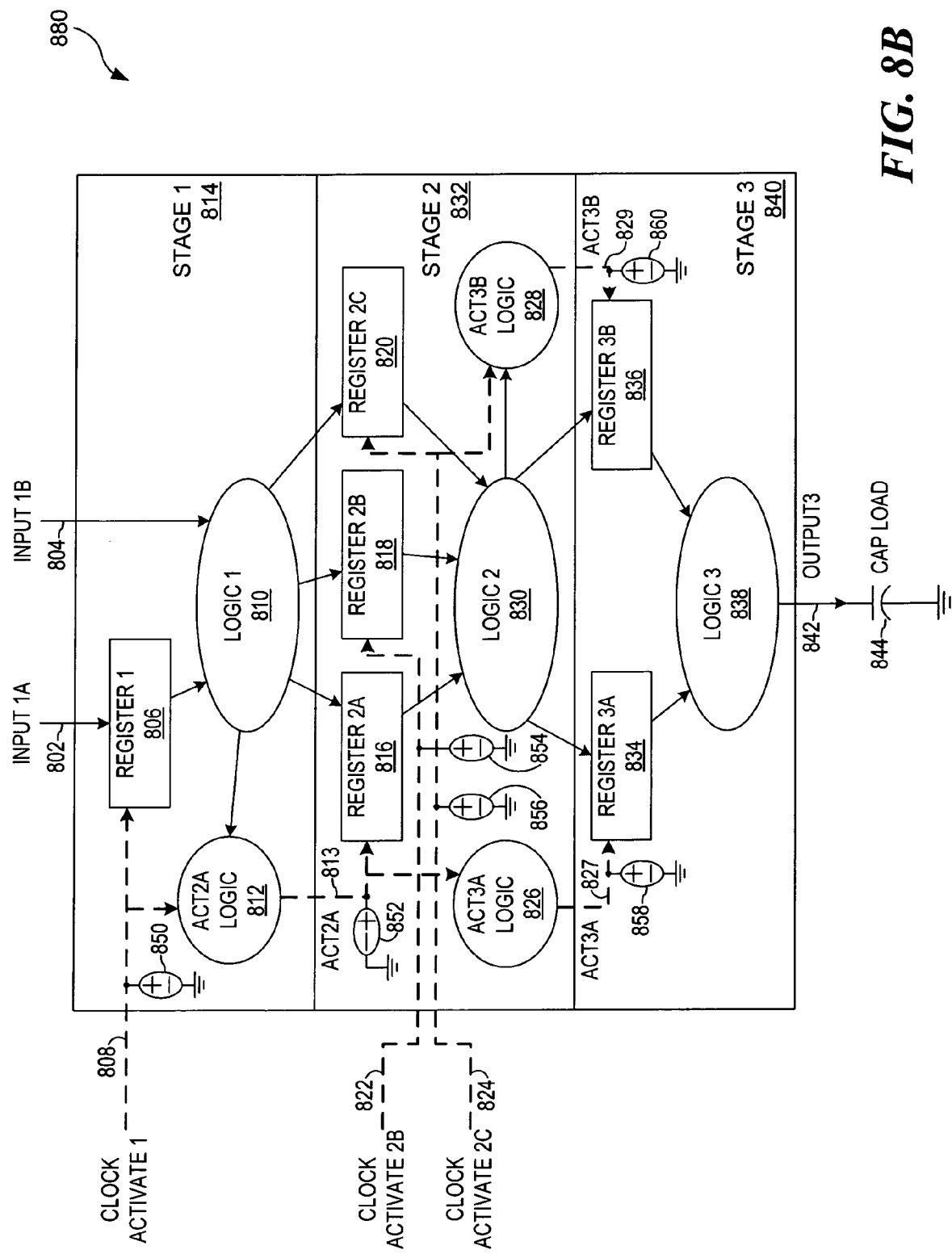
FIG. 8B is a block diagram depicting the macro of FIG. 8A with voltage supplies connected to the external and the internal clock activate signals.

Referring to FIG. 8B of the drawings, reference numeral 880 is a block diagram depicting the macro of FIG. 8A with voltage supplies connected to the external and the internal clock activate signals. Simulations of the power consumption for this type of a macro are handled by computer programs (such as CPAM and ACES). The problem is that the internal logic is different for separate areas of the macro. For example, stage 2 832 of this macro has three clock activate signals 813, 822, and 824, three registers 816, 818, and 820, and three logic blocks 826, 830, and 828. It is difficult to estimate power consumption and run accurate simulations for this macro due to the amount of logic in Stage 2 832.

To rectify this problem voltage supplies have been connected to the outside clock activate signals, 808, 822, and 824, and the internal clock activate signals, 813, 827, and 829. The voltage supplies are added in the computer programs to accurately produce power simulations. Voltage supply 850 is connected to the clock activate 1 signal 808 and is grounded. Voltage supply 852 is connected to the ACT 2A signal 813 and is grounded. Voltage supply 854 is connected to the clock activate 2B signal 822 and is grounded. Voltage supply 856 is connected to the clock activate 2C signal 824 and is grounded. Voltage supply 858 is connected to the ACT 3A signal 827 and is grounded. Voltage supply 860 is connected to the ACT 3B signal 829 and is grounded. These voltage supplies can measure power in separate portions of the macro. Using computer programs (such as CPAM and ACES), power tables can be set up that can accurately estimate the power consumption of this three-stage macro based upon differing input switching factor percentages and clock activation percentages.

Placement of the voltage supplies in the computer program is done through a search algorithm. For example, the designer gives CPAM a circuit name to match in a netlist, which goes into ACES for the simulation. Once the circuit is found the voltage supply is connected to the pins declared by the designer. Once the voltage supplies are connected to all of the clock activate signals, all supplies are set high for 100% clock activity and are all set low for 0% clock activity and the macro power table can be generated. An example of this type of power table is shown in FIG. 6.

Figure 9:
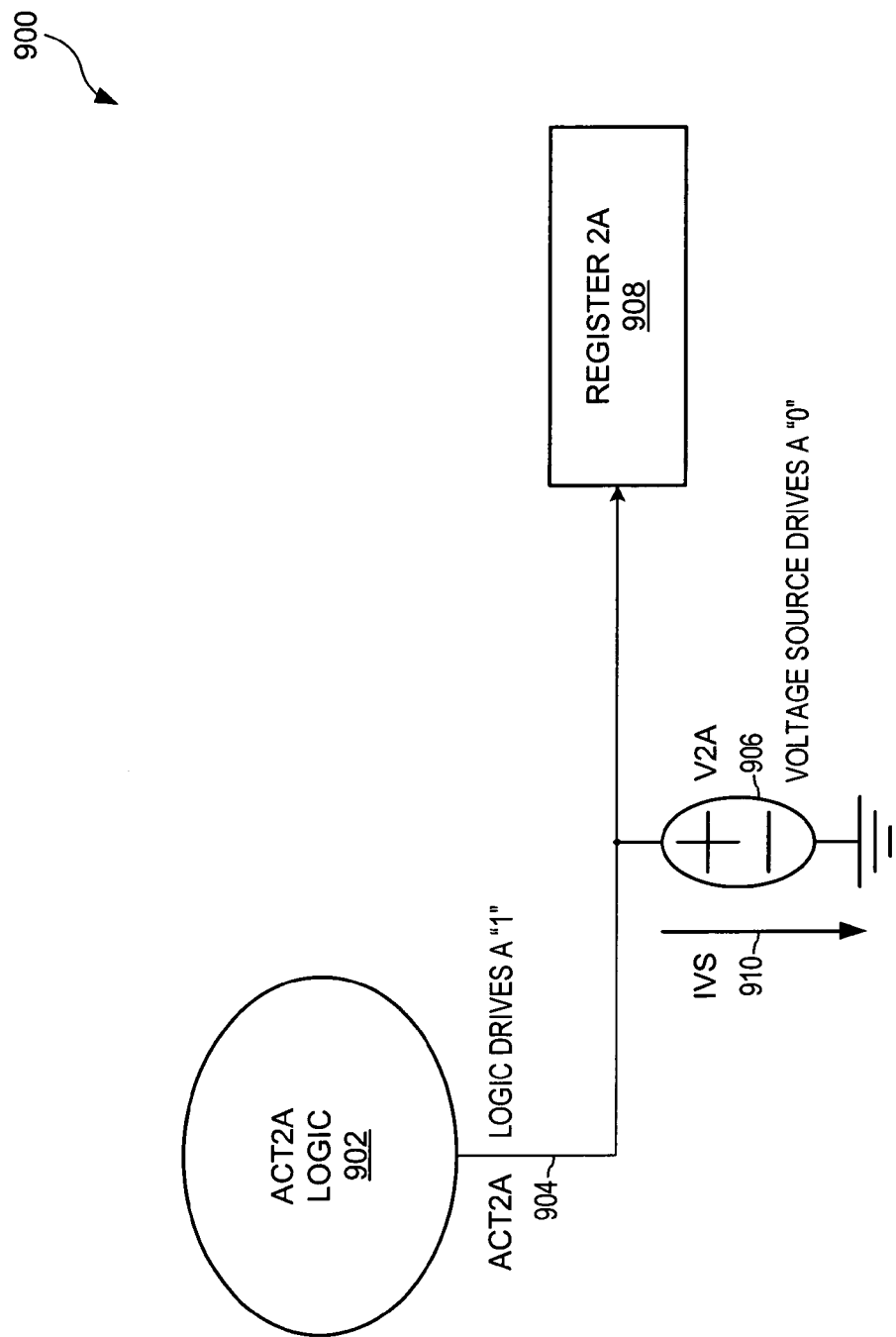
FIG. 9 is a block diagram illustrating the current that flows through a voltage supply that is connected to a clock activate signal.

Referring to FIG. 9 of the drawings, reference numeral 900 is a block diagram illustrating the current that flows through a voltage supply that is connected to a clock activate signal. ACT 2A Logic 902 produces an internal clock activate signal, ACT 2A 904. A voltage supply, V2A 906 is connected to the ACT 2A signal 904 and is grounded. The ACT 2A signal 904 is an input to register 2A 908. FIG. 9 is a detailed illustration of the ACT 2A signal 813 and the voltage supply 852 in FIG. 8B. IVS 910 shows the current that flows through the voltage supply 906. This current 910 is estimated through computer programs.

There is one inherent problem with this method of producing a power table. When the ACT 2A Logic 902 drives the ACT 2A signal 904, opposite the value of the voltage supply 906, extra power supply current is generated and causes an inaccurate estimation of the macro power. For example, if the ACT 2A Logic 902 drives a "1" and the voltage supply 906 drives a "0," then the power estimate of the macro is overestimated. To solve this problem, the wire between the driving logic gate 902 and the voltage supply 906 can be cut for the simulations. This solution can be difficult to implement in a computer program, such as CPAM.

Another solution for this problem is to allow the fighting between the logic 902 and the voltage supply 906 and measure the current, IVS 910, through the ideal voltage supply 906. Then it is possible to subtract this current 910 from the total macro current and the power estimate is correct. When there is fighting between the internal logic of the macro and the voltage supplies added in the computer program, the ideal voltage supplies win. Due to the fighting between the logic 902 and the ideal voltage supply 906 the macro current 910 flowing through the ideal voltage source 906 is subtracted from the total macro current. Overall, with this method an accurate energy table can be generated for a macro with multiple clock gating inputs and multiple internally generated clock activation signals.

The ability to produce these types of power tables is integral for VLSI design. By including clock activation percentage and input switching factor percentage as variables in these power tables the estimates are more accurate. By using voltage supplies in conjunction with the necessary computer programs the present invention is flexible enough to handle power estimates for macros with multiple clock gating inputs and multiple internally generated clock activation signals. If the power consumption of every macro within a chip can be accurately estimated, then the entire chip's power consumption can be accurately estimated. With accurate power estimates designers can attempt to reduce the power consumption of macros, chips, and even complete systems. Minimizing power consumption can increase battery life, reduce packaging costs, and reduce power delivery costs.

Figure 10:
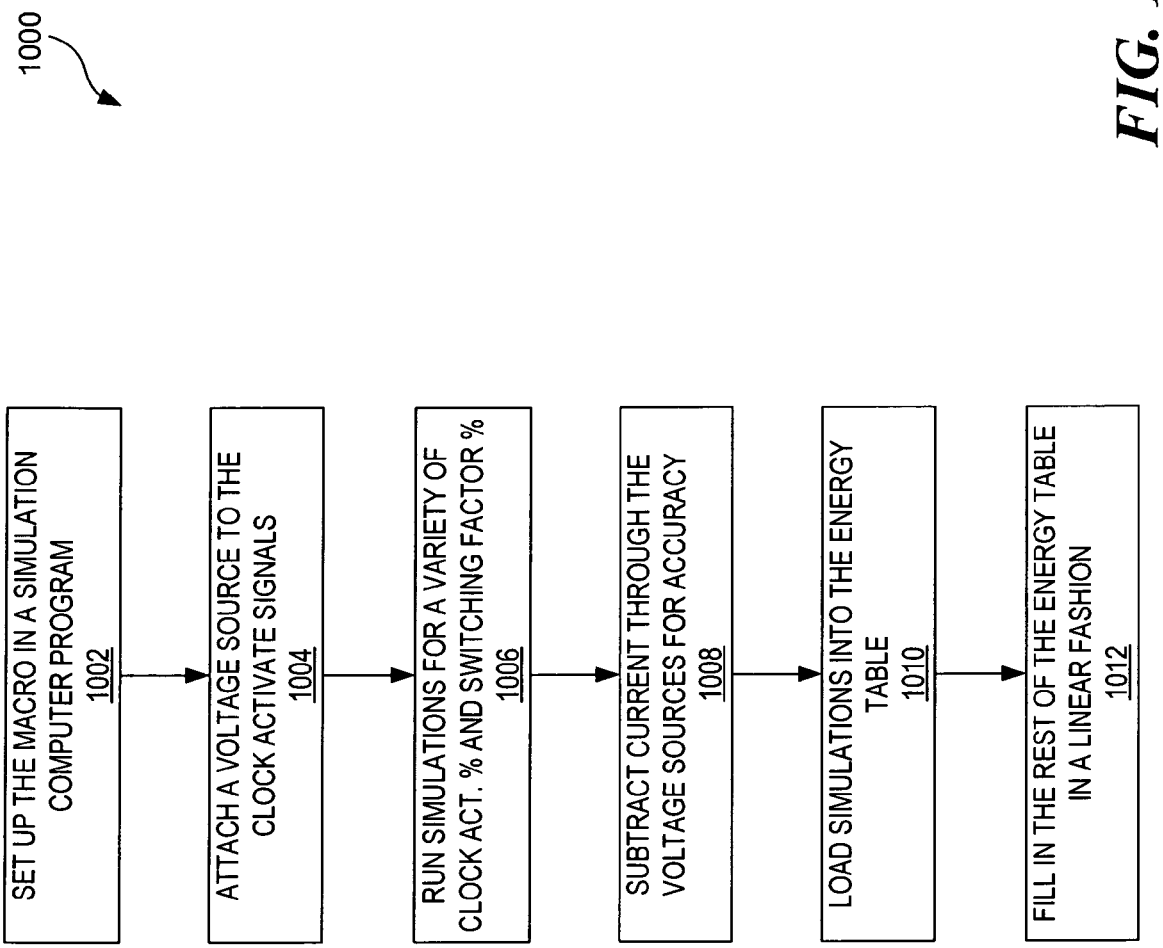
FIG. 10 is a flow chart depicting the method of producing an energy table for a macro containing internal clock gating based upon the input switching factor percentage and the clock activation percentage.

Referring to FIG. 10 of the drawings, reference numeral 1000 is a is a flow chart depicting the method of producing an energy table for a macro containing internal clock gating based upon the input switching factor percentage and the clock activation percentage. First, the model macro is set up in a simulation computer program in step 1002. Then a voltage source is connected to the external and internal clock activate signals in step 1004. Simulations are run for a variety of clock activation percentages and switching factor percentages in step 1006. To obtain accurate estimations the current through each voltage source is subtracted out in step 1008. The resultant simulation values are loaded into the energy table in step 1010. The rest of the values in the energy table are filled in a linear fashion in step 1012. The end result is an accurate energy table for a macro with multiple external clock gating inputs and internally generated clock gating.

It is understood that the present invention can take many forms and embodiments. Accordingly, several variations of the present design may be made without departing from the scope of the invention. The capabilities outlined herein allow for the possibility of a variety of programming models. This disclosure should not be read as preferring any particular programming model, but is instead directed to the underlying concepts on which these programming models can be built.

Having thus described the present invention by reference to certain of its preferred embodiments, it is noted that the embodiments disclosed are illustrative rather than limiting in nature and that a wide range of variations, modifications, changes, and substitutions are contemplated in the foregoing disclosure and, in some instances, some features of the present invention may be employed without a corresponding use of the other features. Many such variations and modifications may be considered desirable by those skilled in the art based upon a review of the foregoing description of preferred embodiments. Accordingly, it is appropriate that the appended claims be construed broadly and in a manner consistent with the scope of the invention.

The invention claimed is:

1. A method for generating a plurality of circuit energy models for a macro using multiple external clock gating inputs including clock activate signals and containing internally generated clock activate signals for a plurality of combinations of the external clock activate signals and the internal clock activate signals, comprising:

generating a power simulation value based on a macro model simulating connecting a voltage supply to at least one of the clock activate signals;

generating a first macro energy table with all of the external clock activate signals and the internal clock activate signals off; and generating a second macro energy table with all of the external clock activate signals and the internal clock activate signals on.

2. The method of claim 1, wherein the step of generating at least one of the plurality of macro energy tables further comprises turning on external clock activate signals and internal clock activate signals for a plurality of combinations until all macro circuit energy states can be computed from the generated macro energy tables.

3. The method of claim 1, wherein the step of generating at least one of the plurality of macro energy tables further comprises setting up a model macro that accurately represents a physical macro.

4. The method of claim 3, wherein the step of generating at least one of the plurality of macro energy tables further comprises producing at least one power simulation value for at least one of a plurality of combinations of the external and internal clock activate signals by using the model macro.

5. The method of claim 4, wherein the step of producing the at least one power simulation value further comprises connecting at least one voltage supply to at least one of the plurality of external clock activate signals and internal clock activate signals.

6. The method of claim 5, wherein the step of producing the at least one power simulation value further comprises connecting a voltage supply to all of the plurality of external clock activate signals and internal clock activate signals.

7. The method of claim 6, wherein the step of producing the at least one power simulation value further comprises subtracting a current through each voltage supply to obtain accurate power simulation values.

8. The method of claim 4, wherein the step of generating at least one of the plurality of macro energy tables further comprises loading the at least one power simulation value into the at least one macro energy table.

9. The method of claim 8, wherein the step of generating at least one of the plurality of macro energy tables further comprises filling in the rest of the at least one energy table in a linear fashion in response to the at least one power simulation value.

\* \* \* \* \*